United States Patent [19]

Nicklaus

[11] 3,941,298
[45] Mar. 2, 1976

[54] PROCESS OF MAKING WIRE CONNECTIONS IN SEMI-CONDUCTOR ELEMENTS

[75] Inventor: Karl Nicklaus, Steinhausen, Switzerland

[73] Assignee: Esec Sales S.A., Zug, Switzerland

[22] Filed: June 5, 1975

[21] Appl. No.: 584,369

Related U.S. Application Data

[63] Continuation-in-part of Ser. No. 411,352, Oct. 25, 1973, abandoned.

[30] Foreign Application Priority Data

Oct. 26, 1972   Switzerland........................ 15635/72

[52] U.S. Cl............... 228/180 A; 228/4.5; 228/179; 29/628
[51] Int. Cl.²...................................... H01L 21/603
[58] Field of Search...................... 228/4.5, 179, 180; 29/203 V, 628

[56] References Cited
UNITED STATES PATENTS

| 3,376,635 | 4/1968  | Moesker......................... 228/179  |
| 3,593,906 | 7/1971  | Hug ................................ 228/4.5 X |
| 3,626,590 | 12/1971 | Miller ............................. 29/628 X |
| 3,705,288 | 12/1972 | Kabana et al..................... 29/203 V |
| 3,787,966 | 1/1974  | Klossika........................... 29/628 |

Primary Examiner—Al Lawrence Smith
Assistant Examiner—K. J. Ramsey
Attorney, Agent, or Firm—Haseltine, Lake & Waters

[57] ABSTRACT

A process characterized in that a linear spare wire conveyed in a tubular member has a wire piece fused-off and retained, at the fused-off end of the wire piece and the spare wire each there being a sphere fused thereon, the wire piece being displaced transverse to the axis of the spare wire and then together with the tubular member conveying the spare wire is moved forward in the direction of the referred-to axis through a predetermined distance in which, during the forward displacement, the sphere formed at the end of the spare wire contacts the tubular piece and is through the pulling-away from the spare wire moved into a position in which this sphere has with reference to a pressing tool for picking up the wire piece is located at a predetermined fixed distance in the direction of the referred-to axis, the wire piece being conveyed transverse to the referred-to axis toward the pressing tool and being picked up by the latter, upon which the tubular member while retaining of the spare wire is moved back into its outlet position, and at both spheres of the wire piece are by means of the pressing tool pressed onto the heated contact locations of the semi-conductor element, whereby during the pressing-on of the spare wire the subsequent wire piece is fused-off in the above-mentioned manner. In a preferred embodiment of the process, the tubular member remains stationary, and the spare wire is essentially embraced in closely spaced relationship by suitable forceps.

26 Claims, 9 Drawing Figures

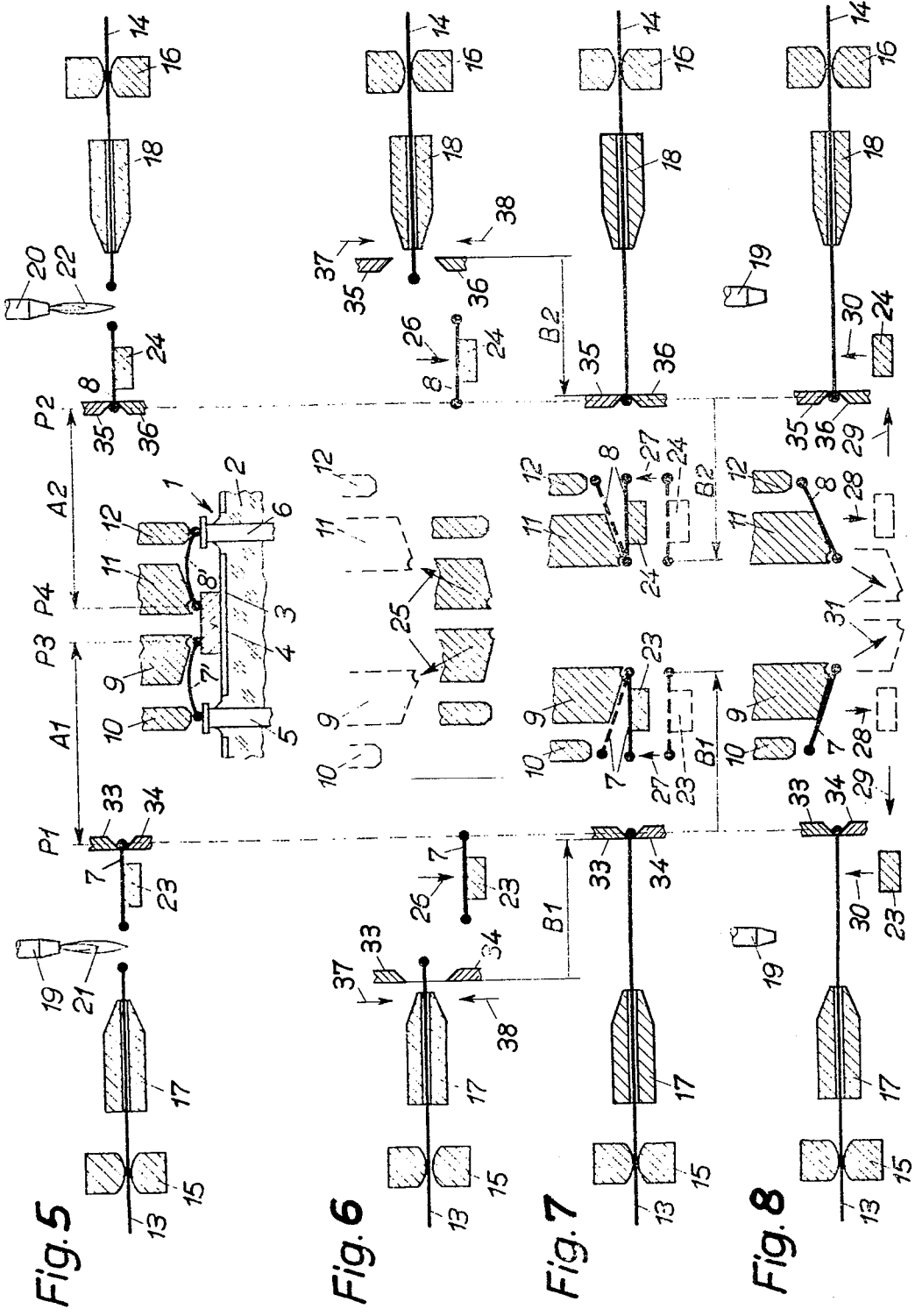

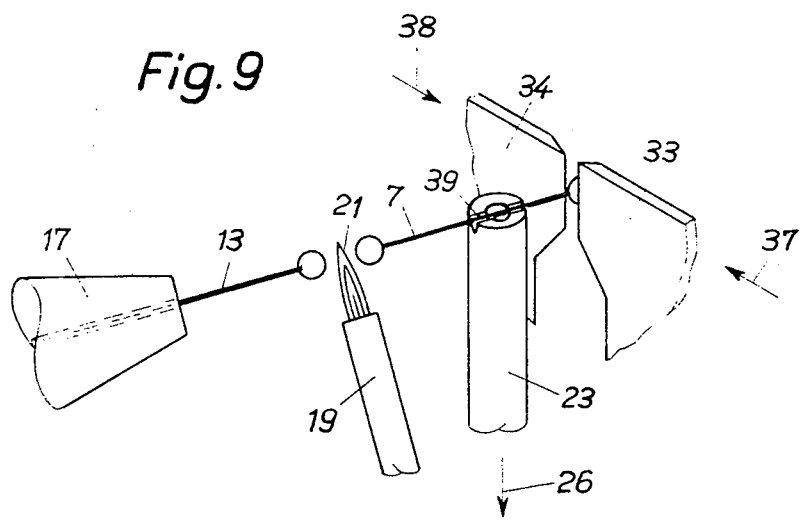

PROCESS OF MAKING WIRE CONNECTIONS IN SEMI-CONDUCTOR ELEMENTS

REFERENCE TO RELATED APPLICATIONS

This application is a continuation-in-part patent application of Ser. No. 411,352; filed Oct. 25, 1973, now abandoned.

FIELD OF THE INVENTION

The present invention relates to a process for the continuous production of at least one wire connection in semiconductor elements, in which process a wire member is prepared and provided at both ends thereof with a fused-on sphere, and in which process the wire pieces are connected with contact locations of the semi-conductor components through thermal compression, as well as to an installation for effecting this process.

DISCUSSION OF THE PRIOR ART

It is known that connecting wire pieces for semiconductor elements, prior to their connection with a semiconductor plate and a contact pin, by means of thermal compression be provided at least at one end thereof with a fused-on sphere, on to press these onto the desired heated location on the semi-conductor element. Inasmuch as the fusing-on of such a sphere, or even of such a sphere onto both ends of the wire piece requires a relatively long time, which is at least as long as the duration of the inherent pressing-on process, in known processes the desired wire connections can be only produced at relatively large time intervals, namely at intervals of approximately 1.5 seconds, whereby it is not possible to provide more than approximately 1,000 semi-conductor elements, for example transistors, with two wire connections per hour.

Representative of the state of the art are Miller U.S. Pat. No. 3,626,590 and Moesker U.S. Pat. No. 3,376,635.

Miller U.S. Pat. No. 3,626,590 consecutively forms the wire connection on the electrical circuit, i.e. a connecting wire piece is not preformed. Instead, the free end of the spare wire is bonded to a first contact point of the circuit. Then the required length of the connecting wire is prepared by fusing-off a wire piece from the spare wire whereupon the other end of the fused-off wire piece is bonded to a second contact point of the circuit. In the present invention, however, wire pieces of the required length are produced far away from the contacting area. Therefore, any danger of damaging the circuit to be wired by the heat of the flame is strictly excluded. Moreover, in the present invention, there is no reliance on a first bonded connection on the circuit for adjusting the required position of the connecting wire piece as does Miller. Therefore, the invention not only avoids any damage to the circuit by orienting and pulling the wire piece one end of which is already fixed to the circuit, but also produces two wire connections, i.e. four bonding connections at the same time, whereas Miller is limited to producing only one bonding connection after the other.

Moesker discloses the forming of wire pieces of predetermined length and conveying the formed wire pieces to a semi-conductive body for producing a connection thereon. However, Moesker uses a thermal compression wedge-bond for producing the connection whilst in the present invention use is made of a thermal compression ball-bond, no balls or spheres have to be formed at the ends of a wire piece, and Moesker uses a knife and a spark electrode for cutting a spare wire into pieces. However, Moesker clearly discloses and only discloses a method using clutch-like means in which two axially aligned wire pieces are formed almost simultaneously, and in which these wire pieces have to remain axially aligned even in the case where only one wire piece is required. For that reason, Moesker cannot bond the wire pieces onto the semi-conductive body in an angular relationship different from axial alignment. In particular, Moesker does not provide the possibility of supplying two wire pieces to the semi-conductive body each from an opposite side of the body.

SUMMARY OF THE INVENTION

The inventive process, in which this disadvantage is eliminated, is characterized that a linear spare wire conveyed in a tubular member has a wire piece fused-off and retained, at the fused-off end of the wire piece and the spare wire each there being a sphere fused thereon, the wire piece being displaced transverse to the axis of the spare wire and then, together with the tubular member conveying the spare wire, is moved forward in the direction of the referred-to axis through a predetermined distance, in which during the forward displacement the sphere formed at the end of the spare wire contacts the tubular piece and is, through the pulling-away from the spare wire, moved into a position in which this sphere with reference to a pressing tool for picking up the wire piece is located at a predetermined fixed distance in the direction of the referredto axis, the wire piece being conveyed transverse to the referred-to axis toward the pressing tool and being picked up by the latter, upon which the tubular member while retaining of the spare wire is moved back into its outlet position, and at both spheres of the wire piece are by means of the pressing tool pressed onto the heated contact locations of the semi-conductor element, whereby during the pressing on of the spare wire the subsequent wire piece is fused-off in the above-mentioned manner.

In a preferred embodiment of the process for the continuous production of at least one wire connection on a semi-conductor element, the process contemplates preparing a wire piece, fusing a sphere onto both ends of the wire piece, and connecting the wire piece with heated contact locations on the semi-conductor element through thermal compression. Herein, the improvement consists of providing a linear spare wire supported in a stationary tubular guide member and which protrudes therefrom with its leading end; gripping the protruding end and fusingoff a wire piece from the spare wire whilst concurrently fusing a sphere onto the fused-off ends of the wire piece and the spare wire; displacing the wire piece transversely to the longitudinal axis of the spare wire from its initial position into a first displaced position; embracing the spare wire with forceps between the tubular guide member and the sphere formed on the end of the spare wire; displacing both the forceps means and the wire piece in a direction along the axis for a predetermined distance, whereby upon displacement of the forceps means the sphere formed on the end of the spare wire contacts the forceps means and by continued displacement of the forceps is conveyed through motion of the spare wire into a predetermined position along the axis, and whereby the wire piece occupies a second displaced position. The wire piece is then conveyed transversely to the axis towards a pressing tool, whereby the wire piece occupies a third displaced position; the wire piece is taken up by the pressing tool; both the spheres are pressed on the wire piece through actuation of the pressing tool onto the heated contact locations on the semi-conductor element; and concurrent with the pressing-on, the protruding end of the spare wire is gripped adjacent the forceps embracing the spare wire, and a subsequent wire piece is fusedoff from the spare wire.

BRIEF DESCRIPTION OF THE DRAWINGS

Refering to the exemplary embodiments in the drawings of the referred to installation, the present inventive process is described in further detail, having reference to the drawings, in which:

FIGS. 5 through 8 illustrate schematically a second embodiment of the installation for carrying out a modified process pursuant to the invention; and FIG. 9 is an enlarged perspective detailed view of a forceps arrangement employed in the installation of FIGS. 5 to 8.

DETAILED DESCRIPTION

Figures 1, 2, 3, 4:
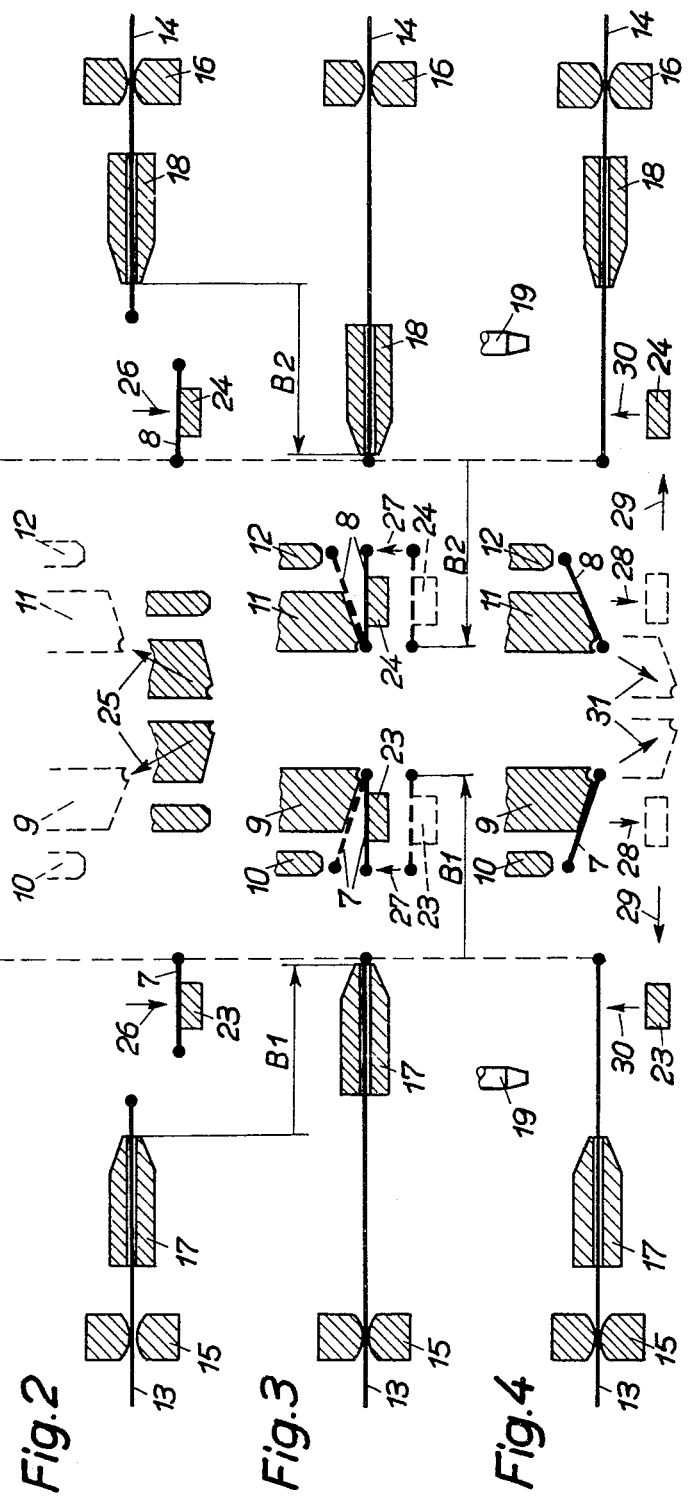
FIGS. 1 through 4 illustrate schematically a first embodiment of an installation for the carrying out of the inventive process during various sequential process steps in which there is disclosed the forward movement of a wire, the fusing-off of a wire piece, the movement of the wire piece and its transfer onto a stylus, as well as the pressing on of the wire piece through the stylus onto a semi-conductor plate.

In the arrangement of FIG. 1 there is illustrated a semi-conductor element 1 which may be, for example, a transistor, which includes semi-conductor plates 4 fastened to a base 2 through a metal layer 3, in which the metal layer 3 serves as an electrode connection, for example, as a collector connection. For connection of both other electrodes, in effect, the base and emitter electrode, the base 2 is provided with two contact pins 5 and 6, to which the mentioned electrodes are connected through connector wire pieces 7' and respectively 8', or are adapted to be attached thereto. For connection of the wire pieces with the corresponding locations on the semi-conductor plates 4 and with the contact pins 5 and 6, there is utilized the so-called thermal compression process, in which a small sphere which is fused to each of the wire pieces is pressed onto the corresponding heated element.

The present installation for carrying out of the inventive process, as shown in detail in FIGS. 5 to 7, provides for each to-be-connected connecting wire piece 7', 8', two styli 9, 10 and, respectively, 11 and 12, which together are movable toward or away from the semi-conductor element 1. The one stylus 9 and, respectively, 11, includes a recess for receiving the sphere which is fused to the wire piece 7' and, respectively, 8', whereas the other stylus 10 and, respectively, 12 includes a smooth upper surface, or similarly includes a recess for the sphere. The first-mentioned stylus 9 and, respectively, 11 have thereby an inclined upper surface which, by means of a groove (not shown) are adapted to receive a portion of the wire pieces 7' and, respectively, 8', this groove, for example, being provided with an aperture leading to a vacuum source so as to retain the wire piece against the stylus. The semi-conductor element 1, as shown in FIG. 1 here together with further similar elements is provided within a horizontal direction movable conveyor arrangement (not shown).

The described apparatus further is provided with two identical wire infeed devices. A wire 13 which is pulled off from a suitable spare wire roll (not shown), for example a gold wire, is conveyed through a wire brake 15 and, respectively, 16 through a capillary arrangement 17 and, respectively, 18, and moves from the latter toward a fusing or smelting-off installation 19, and, respectively, 20 having a periodically wire contacting flame 21, 22. In lieu of the foregoing, there may also be provided the formation of a plasma flame or a light arc-forming smelting arrangement. For the retention of the wire end there is provided a wire holder 23, 24, onto which the wire 13, 14 is clamped fast by means, for example, of a vacuum. The capillary installation 17, 18 and the wire holder 23, 24 are mechanically interconnected with each other (not shown) and are arranged so the capillary installation and the wire holder are jointly displaceable in the direction of the axis of the wire 13, 14, while the wire holder independently of the capillary installation is displaceable in a direction extending vertically to the axis of the wire.

In FIG. 1 the drive elements, for example, such as cam plates actuated arms for the styli 9, 10, 11 and 12, the capillary arrangements 17 and 18 and the wire holder 23 and 24 for carrying out of the following described actuating processes are not described.

For carrying out of the present process, the referredto arrangement is actuated for example in the following manner as disclosed in FIGS. 1 through 7.

According to FIG. 1, at a predetermined time point of the process, the styli 9, 10 and, respectively, 11 and 12 press the spheres fused onto the ends of the introduced wire pieces 7', 8' as well as the provided structure with the position P3, P4, against the semi-conductor plate 4 and the upper surface of the contact pins 5, 6. Since the semi-conductor element 1 is heated to a temperature of approximately 300°C. to 360°C., there is formed through the pressure force a rigid mechanical and electrical connection of the respective wire pieces with the semi-conductor plates 4 and the contact pins 5 and 6.

Concurrently, the wire which has been pulled off from the spare roll is conducted through the wire brake 15, 16 and through the capillary installations 17, 18, whose sphere previously fused to the wire end is introduced into a predetermined position P1, P2 a fixed distance A1, A2 from the desired position on the semi-conductor plate 4, the flame 21, 22 of the smelting arrangement 19, 20 is shut off, and in effect at such a distance from the wire end (position P1, P2) so that the wire piece 7, 8 formed after the fusing-off has at least proximate its required length. At the fusing-off there is formed a sphere at both remaining wire portions, the wire piece 7, 8 and the spare wire 13, 14, which may be ascertained from FIG. 1. The fused-off wire piece 7, 8 is thereby retained by means of the wire holder 23, 24, whereas the spare wire 13, 14 is further retained through the capillary arrangement 17, 18.

In the next phase of the operative sequence of the present installation, described in FIG. 2, the styli 9, 10, and 11 and 12 are raised and moved apart from each other, they are also moved from the previously disclosed extended position in accordance with arrows 25 into a new chain-dotted illustrated position, which is provided for the following described transfer of the fused-off wire pieces 7 and 8. Furthermore, each wire holder 23 and 24 is displaced downwardly along arrows 26 from the axis of the wire 13 and 14, whereas the position of the capillary arrangement 17 and 18 remains unchanged. Concurrently through a not described conveyor arrangement, the semi-conductor element 1 provided with the wire connection as in FIG. 1, is conveyed away and a new semi-conductor element which is to be provided with a wire connection is moved into the position shown in FIG. 1.

In the next process step the capillary arrangement 17, 18 is displaced along the axis of the wire 13, 14 in the direction toward the styli 9, 10 and, respectively, 11 and 12 through a predetermined distance B1, B2 (FIG. 3). The sphere previously fused to the ends of the wire 13, 14 lies at the capillary aperture, is taken along by the displacement of the wire by the capillary installation 17, 18 and pulled off from the spare wire. The length of distance B1, B2 is so determined whereby the sphere at the respective wire end moves precisely into the position P1. The predetermined forward movement distance B1, B2 of the capillary arrangement 17, 18 enables the referred-to sphere to be always brought into the equal position P1 although the position of the fused-on sphere shown in FIG. 1 in the direction of the axis of the wire 13, 14 may be varied on the basis of the fusing sequence. The wire brake 15, 16 rigidly retains the wire 13, 14 in its forwardly moved location.

Upon conveyance forward of the capillary arrangement 17, 18, also the wire piece 7, 18 supporting the wire holder 23, 24 which for this movement of direction is rigidly connected with the associated capillary arrangement, is displaced for the distance B1, B2 and assumes the illustrated new chain-dotted position. The length of the forward moving distance B1, B2, and upon raising of the styli 9, 10, 11, 12 the following displacement in the direction of the axis of the wire 13, 14 are so predetermined with respect to each other, whereby the spheres on the ends of the wire pieces 7, 8, spaced from the capillary arrangements 17, 18 are positioned perpendicular to the axis of the wire 13, 14 below the recesses formed on the styli 9 and 11.

In the next process step, which is also shown in FIG. 3, the wire holder 23, 24 is displaced perpendicularly to the axis of the wire 13, 14 from the chain-dotted illustrated position toward the styli 9 and 10, and, respectively, 11, 12 so far along the direction of the arrows 27, whereby the sphere on the wire piece 7, 8 is positioned in the therefore provided recess in the styli 9, and 11. Due to the illustrated simplification the end postion of the wire piece 7, 8 parallel to the axis of the wires 13, 14 is extendedly illustrated. In actuality, however, through the movement of the wire holder 23, 24, the wire piece 7, 8 is accurately positioned conveyed towards the styli 9, and 10 into the previously mentioned groove formed in the inclined upper surface of the cutters 9 and 11, as illustrated in chain-dotted lines in FIG. 3. In this position, the wire piece 7, 8 is retained by the styli 9, 11 by means of a vacuum, while the connection with the wire holder 23, 24 caused by the vacuum is released.

In the further process steps shown in FIG. 4, at first the wire holder 23, 24 is again moved away from the styli 9, 11 along arrow 28 and is conveyed into the chain-dotted illustrated position which coincides with the chain-dotted position illustrated in FIG. 3. Thereby the capillary arrangement 17, 18 and the wire holder 23, 24 are displaced rearwardly, (arrow 29) so that these elements assume the position shown in FIG. 2, whereas the wire 13, 14 is further retained by means of the wire brake 15, 16. Subsequently, the wire holder 23, 24 is displaced in the direction of arrow 30 toward wire 13, 14, which again retains the wire holder by means of a vacuum.

The styli 9, 10, 11, 12 are now moved downwardly towards the previously introduced, heated, semi-conductor component (not shown in FIG. 4) in the direction of arrow 31. As may be ascertained from FIGS. 2 through 4, in the at rest position the styli 9, 12 are raised higher than the styli 9, 11. Upon lowering of the styli towards the semi-conductor element, at first there press the styli 9, 11 supporting the wire piece 7, 8, the sphere of the wire piece located in its recesses onto the semi-conductor plate 4 (FIG. 1). Only subsequently do the styli 10, 12 press the sphere located at the other end of the wire piece against the surface of the contact pins 5, 6. Thereby the bent or arcuate arrangement of the wire piece 7, 8 illustrated in FIG. 1 is automatically obtained, so that these wire pieces do not in any undesirable manner touch any other portions of the semi-conductor component 1.

With the pressing on of the wire pieces 7, 8 onto the semi-conductor plates 4 and onto the contact pins 5 and 6, the smelting arrangement 19, 20 (FIGS. 4, 1) is placed into operation, through which the subsequent wire pieces 7, 8 inclusive of their two spheres, as well as the first sphere of the subsequent wire piece are formed. Thereby there is achieved anew the process relationship illustrated in FIG. 1, in view of which the described process is continuously repeated.

The described process may be carried out within an extremely short time period, since at each time after the pressing-on of the wire piece, the required wire pieces for the subsequent pressing sequence are, in effect, readied and need not be prepared in any process step requiring additional time intervals. It is further possible that for each 0.6 seconds a semi-conductor element is provided with two wire connections. Approximately 0.3 seconds are required for the pressing-on of the wire piece onto the semi-conductor plates and the contact pins, and for the concurrent fusing-off of the subsequent wire piece inclusive of the desired fusing-on of the spheres. The remaining 0.3 seconds are utilized for material transportation. It is thereby possible to provide, for each hour, 12,000 wire connections, in effect, 6,000 semi-conductor elements which are each provided with two wire connections.

The drive elements for the styli 9, 10, 11, 12, the capillary arrangements 17 and 18 and the wire holder 23 and 24, may incorporate suitable valve elements for the in-and-out switching of the vacuum in the styli 9, 11 and wire holders 23, 24 as well as for the conveyor arrangement for the semi-conductor elements 1 which may be controlled by mechanical, electrical, electromagnetic, pneumatic or hydraulic means so as to provide a fully automatic sequence of the described process steps without complex requirements. In the event that the semi-conductor elements positioned on the conveyor arrangement are not identically shaped, there may be provided an arrangement in which the elements, prior to the described formation, are provided with wire connections. This arrangement may, in a known manner, encompass a focal point projector, a stereo-microscope, and a manipulator.

In the described exemplary process provided, for example, in a transistor are concurrently two wire connections by means of the wire pieces 7 and 8. It is, however, possible to provide for each semi-conductor element only a single wire connection, as may be required, for example, in light diodes. When two wire connections, as in the described example, are required, then the described process has the advantage that the critical distance of both connecting points on the semi-conductor plate 4, in effect the defined distance which are between positions 3 and 4, is required to be identical for each of the sequentially processed semi-conductor elements. Thereby this obviates the necessity for various further adjusting operations, which are required in known processes, in order to assure that for each semi-conductor plate both of the wire connections are positioned at exactly the same locations and in precisely the same spatial relationship.

In FIGS. 1 through 4, the spare wires 13, 14 and the wire pieces 7 and 8 are illustrated, as well as further organs, in a common plane. However, it is to be understood that both of the described wire connections also may be formed at angles of less than 180°, for example at right angles to each other. In contrast to the arrangement shown in FIGS. 1 through 4, the axis of a spare wire 13 or 14, including wire brake, capillary arrangement and wire holder may oscillate across the axis of the other spare wire through any desired angle. Through the same angle it is also possible to oscillate the plane of a styli pair 9, 10 or 11, 12 in comparison with the plane of the other styli pair. Further, obviously, both wire connections and wire pieces 7, 8 may have varied lengths. A significant advantage of the present process lies in that at each position, the measurement of the required wire connection or connections may be correlated and in each instance an unvarying precision is obtained with the disclosed wire connection.

The arrangement of FIGS. 5 through 9 is somewhat similar to that of FIGS. 1 through 4, and like elements are designated by identical reference numerals.

The described apparatus further is provided with two identical wire infeed devices. In this arrangement, however, wire 13 which is pulled off from a suitable spare wire roll (not shown), for example a gold wire, is conveyed through a wire brake 15 and, respectively, 16 through a stationary capillary arrangement 17 and, respectively, 18, and moves from the latter toward a fusing or smelting-off installation 19, and, respectively, 20 having a periodically wire contacting flame 21, 22. In lieu of the foregoing, there may also be provided the formation of a plasma flame or a light arc-forming smelting arrangement. For the retention of the wire end there is provided a wire holder 23, 24, onto which the wire 13, 14 is clamped fast by means, for example, of a vacuum. Forceps means having each a pair of forceps members 33, 34 and 35, 36, respectively, are shown to embrace the wires 13 and 14 in closely spaced relationship near the wire ends in a manner described below. The wire holder 23, 24 is arranged to be displaceable in a direction extending vertically to the longitudinal axis of the wire 13, 14 and in the direction of the axis of the wire 13, 14. The forceps members 33, 34, 35, 36 so the members 33, 34 and 35, 36, respectively, of each pair are simultaneously displaceable in opposite directions vertically to the longitudinal axis of the wire 13, 14 and jointly in the direction of the axis of the wire 13, 14.

In FIG. 5 the drive elements, for example, such as cam plates actuated arms for the styli 9, 10, 11 and 12, the wire holder 23, 24 and the foreceps members 33, 34, 35, 36 for carrying out of the following described actuating processes are not described.

For carrying out of the present process, the referred-to arrangement is actuated for example in the following manner as disclosed in FIGS. 5 through 8.

According to FIG. 5, at a predetermined timepoint of the process, the styli 9, 10 and, respectively, 11 and 12 press the spheres fused onto the ends of the introduced wire pieces 7',8' as well as the provided structure with the position P3, P4, against the semi-conductor plate 4 and the upper surface of the contact pints 5, 6. Since the semi-conductor element 1 is heated to a temperature of approximately 300°C. to 360°C., there is formed through the pressure force a rigid mechanical and electrical connection of the respective wire pieces with the semi-conductor plates 4 and the contact pins 5 and 6.

Concurrently, the wire which has been pulled off from the spare roll is conducted through the wire brake 15, 16 and through the capillary installations 17, 18, whose sphere previously fused to the wire end is introduced into a predetermined position P1, P2 a fixed distance A1, A2 from the desired position on the semi-conductor plate 4, the flame 21, 22 of the smelting arrangement 19, 20 is shut off, and in effect at such a distance from the wire end (position P1, P2) so that the wire piece 7, 8 formed after the fusing-off has at least proximate its required length. At the fusing-off there is formed a sphere at both remaining wire portions, the wire piece 7, 8 and the spare wire 13, 14, which may be ascertained from FIG. 5. The fused-off wire piece 7, 8 is thereby retained by means of the wire holder 23, 24 and forceps members 33, 34 and 35, 36, whereas the spare wire 13, 14 is further retained through the capillary arrangement 17, 18.

In the next phase of the operative sequence of the present installation, described in FIG. 6, the styli 9, 10 and 11 and 12 are raised and moved apart from each other, they are also moved from the previously disclosed extended position in accordance with arrows 25 into a new chain-dotted illustrated position, which is provided for the following described transfer of the fused-off wire pieces 7 and 8. Forceps members 33, 34 and 35, 36, respectively, are simultaneously withdrawn from wire pieces 7 and 8, and then moved in the direction of the axis of wire 13, 14 into the position adjacent the capillary arrangement 17, 18 as shown in FIG. 6. Furthermore, each wire holder 23 and 24 is displaced downwardly along arrows 26 from the axis of the wire 13 and 14. Concurrently through a not described conveyor arrangement, the semi-conductor element 1 provided with the wire connection as in FIG. 5, is conveyed away and a new semi-conductor element which is to be provided with a wire connection is moved into the position shown in FIG. 5.

In the next process step the forceps members 33, 34 and 35, 36 of each pair are again moved towards the wire 13, 14 in the direction of the arrows 37 and 38, and stopped in such position that the wire 13, 14 is not clamped by the forceps members 33, 34 and 35, 36, but is free to glide between the respective forceps members. Each pair of forceps members 33, 34 and 35, 36 is then displaced along the axis of the wire 13, 14 in the direction toward the styli 9, 10 and, respectively, 11 and 12 through a predetermined distance B1, B2 (FIG. 7). The sphere previously fused to the ends of the wire 13, 14 lies at the aperture formed by each pair of forceps members, is taken along by the displacement of the wire by the forceps members and pulled off from the spare wire. The length of distance B1, B2 is so determined whereby the sphere at the respective wire end moves precisely into the position Pl. The predetermined forward movement distance B1, B2 of the forceps members 33, 34 and 35, 36 enables the referred-to sphere to be always brought into the equal position P1 although the position of the fused-on sphere shown in FIG. 5 in the direction of the axis of the wire 13, 14 may be varied on the basis of the fusing sequence. The wire brake 15, 16 rigidly retains the wire 13, 14 in its forwardly moved location.

Upon conveyance forward of the forceps members 33, 34 and 35, 36, also the wire piece 7, 18 supporting the wire holder 23, 24 which for this movement of direction is rigidly connected with the associated forceps members, is displaced for the distance B1, B2 and assumes the illustrated new chain-dotted position. The length of the forward moving distance B1, B2, and upon raising the styli 9, 10, 11, 12 the following displacement in the direction of the axis of the wire 13, 14 are so predetermined with respect to each other, whereby the spheres on the ends of the wire pieces 7, 8 are positioned perpendicular to the axis of the wire 13, 14 below the recesses formed on the styli 9 and 11.

In the next process step, which is also shown in FIG. 7, the wire holder 23, 24 is displaced perpendicularly to the axis of the wire 13, 14 from the chain-dotted illustrated position toward the styli 9 and 10, and, respectively, 11, 12 so far along the direction of the arrows 27, whereby the sphere on the wire piece 7, 8 is positioned in the therefore provided recess in the styli 9, and 11. Due to the illustrated simplification the end position of the wire piece 7, 8 parallel to the axis of the wires 13, 14 is extendedly illustrated. In actuality, however, through the movement of the wire holder 23, 24, the wire piece 7, 8 is accurately positioned conveyed towards the styli 9, and 10 into the previously mentioned groove formed in the inclined upper surface of the cutters 9 and 11, as illustrated in chain-dotted lines in FIG. 3. In this position, the wire piece 7, 8 is retained by the styli 9, 11 by means of a vacuum, while the connection with the wire holder 23, 24 caused by the vacuum is released.

In the further process steps shown in FIG. 8, at first the wire holder 23, 24 is again moved away from the styli 9, 11 along arrow 28 and is conveyed into the chain-dotted illustrated position which coincides with the chain-dotted position illustrated in FIG. 7. Thereby the wire holder 23, 24 is displaced rearwardly, (arrow 29) so that it assumes the position shown in FIG. 8, whereas the wire 13, 14 is further retained by means of the wire brake 15, 16 and the forceps members 33, 34 and 35, 36. Subsequently, the wire holder 23, 24 is displaced in the direction of arrow 30 toward wire 13, 14, which again retains the wire holder by means of a vacuum.

The styli 9, 10, 11, 12 are now moved downwardly towards the previously introduced, heated, semi-conductor component (not shown in FIG. 8) in the direction of arrow 31. As may be ascertained from FIGS. 6 through 8, in the at rest position the styli 9, 12 are raised higher than the stlyi 9, 11. Upon lowering of the styli towards the semi-conductor element, at first there press the styli 9, 11 supporting the wire piece 7, 8, the sphere of the wire piece located in its recesses onto the semi-conductor plate 4 (FIG. 5). Only subsequently do the styli 10, 12 press the sphere located at the other end of the wire piece against the surface of the contact pins 5, 6. Thereby the bent or arcuate arrangement of the wire piece 7', 8' illustrated in FIG. 5 is automatically obtained, so that these wire pieces do not in any undesirable manner touch any other portions of the semiconductor component 1.

With the pressing on of the wire pieces 7, 8 onto the semi-conductor plates 4 and onto the contact pins 5 and 6, the smelting arrangement 19, 20 (FIGS. 8, 5) is placed into operation, through which the subsequent wire pieces 7, 8 inclusive of their two spheres, as well as the first sphere of the subsequent wire piece are formed. Thereby there is achieved anew the process relationship illustrated in FIG. 5, in view of which the described process is continuously repeated.

FIG. 9 illustrates in a perspective view the capillary arrangement, the fusing or smelting-off installation, the wire holder and the forceps members in their respective positions shown in FIG. 5. The wire 13 is shown to protrude from the capillary arrangement 17 with its end portion on which the sphere has just been formed by the fusing or smelting-off installation 19 with the flame 21. The wire piece 7 having spheres formed on both ends is gripped in its mid-portion by the wire holder 23 which has the form of a tube connected to a vacuum source (not shown). The upper open end of the tube 23 is provided with a V-formed groove 39 for receiving the wire piece 7 and firmly holding it in the groove 39 by means of the vacuum forces. The arrow 26 indicates, as in FIG. 6, the direction in which the tube 23 is moved vertically to the axis of the wire 13 to displace the wire piece 7.

At the end of the wire piece 7 opposite the flame 21, two forceps members 33 and 34 are shown to have the form of slides or plates located in a common plane which extends vertically to the axis of the wire piece 7. Opposite inner edges of the slides 33, 34 form a gap for guiding the wire piece 7. The outer faces of the slides 33, 34 adjacent to the gap are in contact with the sphere formed on the end of the wire piece 7. The direction in which the slides 33, 34 are moved towards the wire piece 7 is indicated by the arrows 37 and 38, in accordance with FIG. 6. As mentioned before, it should be noted that the wire piece 7 is not rigidly clamped between the slides 33 and 34. Therefore, in the process step leading from FIG. 6 to FIG. 7, the slides 33, 34 glide along the wire 13, contact the sphere formed on the end of the wire 13 and, with continued movement, pull the wire 13 through the capillary arrangement 17 until the sphere assumes the position P1 shown in FIG. 7. When in the further step the wire holder 23 is again approached to the wire 13, as shown by arrow 30 in FIG. 8, the wire will necessarily engage the V-formed groove 39 of the wire holder 23 (see FIG. 9), since the wire 13 is preventing from escaping laterally in a direction transverse to the direction of movement of the wire holder 23, by the guiding gap formed between the forceps members or slides 33, 34.

The described processes may be carried out within an extremely short time period, since at each time after the pressing-on of the wire piece, the required wire pieces for the subsequent pressing sequence are, in effect, readied and need not be prepared in any process step requiring additional time intervals. It is further possible that for each 0.6 seconds a semi-conductor element is provided with two wire connections. Approximately 0.3 seconds are required for the pressing-on of the wire piece onto the semi-conductor plates and the contact pins, and for the concurrent fusing-off of the subsequent wire piece inclusive of the described fusing-on of the spheres. The remaining 0.3 seconds are utilized for material transportation. It is thereby possible to provide, for each hour, 12,000 wire connections, in effect, 6,000 semi-conductor elements which are each provided with two wire connections.

The drive elements for the styli 9, 10, 11, 12, the wire holder 23 and 24, and the forceps members 33, 34 and 35, 36, may incorporate suitable valve elements for the in-and-out switching of the vacuum in the styli 9, 11 and wire holders 23, 24, as well as for the conveyor arrangement for the semi-conductor element 1 which may be controlled by mechanical, electrical, electromagnetic, pneumatic or hydraulic means so as to provide a fully automatic sequence of the described process steps without complex requirements. In the event that the semi-conductor elements positioned on the conveyor arrangement are not identically shaped, there may be provided an arrangement in which the elements, prior to the described formation, are provided with wire connections. This arrangement may, in a known manner, encompass a focal point projector, a stereo-microscope, and a manipulator.

In the described exemplary process provided, for example, in a transistor are concurrently two wire connections by means of the wire pieces 7 and 8. It is, however, possible to provide for each semi-conductor element only a single wire connection, as may be required, for example, in light diodes. When two wire connections, as in the described examples, are required, then the described process has the advantage that the critical distance of both connecting points on the semi-conductor plate 4, in effect the defined distance which are between positions 3 and 4, is required to be identical for each of the sequentially processed semi-conductor elements. Thereby this obviates the necessity for various further adjusting operations, which are required in known processes, in order to assure that for each semi-conductor plate both of the wire connections are positioned at exactly the same locations and in precisely the same spatial relationship.

In FIGS. 1 through 8, the spare wires 13, 14 and the wire pieces 7 and 8 are illustrated, as well as further organs, in a common plane. However, it is to be understood that both of the described wire connections also may be formed at angles of less than 180°, for example at right angles to each other. In contrast to the arrangement shown in FIGS. 1 through 8, the axis of a spare wire 13 or 14, including wire brake, capillary arrangement, wire holder and forceps members may be swiveled across the axis of the other spare wire through any desired angle. Through the same angle it is also possible to swivel the plane of a styli pair 9, 10 or 11, 12 in comparison with the plane of the other styli pair. Further, obviously both wire connections and wire pieces 7, 8 may have varied lengths. A significant advantage of the present process lies in that at each position, the measurement of the required wire connection or connections may be correlated and in each instance an unvarying precision is obtained with the disclosed wire connection.

While there has been shown what is considered to be preferred embodiments of the invention, it will be obvious that modifications may be made which come within the scope of the disclosure of the specification.

What is claimed is:

1. In a process for the continuous production of at least one wire connection on a semi-conductor element, said process including preparing a wire piece, fusing a sphere onto both ends of said wire piece, and connecting the wire piece with heated contact locations on the semi-conductor element through thermal compression, the improvement comprising: providing a linear spare wire supported in a tubular guide member and protruding therefrom with its leading end; gripping said protruding end and fusing-off a wire piece from the spare wire whilst concurrently fusing a sphere onto the fused-off ends of the wire piece and the spare wire; displacing the wire piece transversely to the longitudinal axis of the spare wire from its initial position into a first displaced position; displacing both the tubular guide member supporting the spare wire and the wire piece in a direction along said axis for a predetermined distance, whereby upon displacement of the tubular guide member the sphere formed on the end of the spare wire contacts the tubular guide member and by continued displacement of the tubular guide member is conveyed through motion of the spare wire into a predetermined position along said axis, and whereby the wire piece occupies a second displaced position; conveying the wire piece transversely to said axis towards a pressing tool, whereby the wire piece occupies a third displaced position; taking up the wire piece by the pressing tool, returning the tubular guide member in a direction along said axis into its initial position while retaining the spare wire supported therein in a fixed position, whereby the spare wire again protrudes from the tubular guide member with its leading end; pressing both said spheres on the wire piece through actuation of the pressing tool onto said heated contact locations on the semi-conductor element; and concurrent with the pressing-on, gripping said protruding end of the spare wire and fusing-off a subsequent wire piece from the spare wire.

2. A process as claimed in claim 1, characterized in that two said wire connections are concurrently produced on the semi-conductor element.

3. A process according to claim 2, characterized in that there are formed two wire connections of varied lengths.

4. A process according to claim 2, characterized in that there are formed two wire connections having a mutual angular displacement deviating from 180°.

5. A process according to claim 2, characterized in that there are formed two wire connections of varied lengths and having a mutual angular displacement deviating from 180°.

6. A process according to claim 1, characterized in that the first sphere formed on the wire piece is connected with a semi-conductor wafer of the semi-conductor element and the subsequently formed sphere on said wire piece is connected with a contact pin of the semi-conductor element.

7. A process according to claim 6, characterized in that said pressing of one said sphere of the wire piece onto the contact element of the semi-conductor element is delayed with respect to the pressing-on of the other sphere of said wire piece onto said semi-conductor element, so as to attain an arcuate configuration of the connecting wire piece.

8. A process according to claim 2, characterized in that the tubular guide member comprises a capillary tube.

9. A process according to claim 2, characterized in that, for the fusing-off the wire piece and the fusing-on of the spheres, there is utilized a flame.

10. A process according to claim 2, characterized in that for the fusing-off the wire piece and the fusing-on of the spheres, there is utilized a light arc.

11. A process according to claim 2, characterized in that for gripping, displacing and conveying the wire piece there is utilized a vacuum wire holder and for taking up of the wire piece by the pressing tool the latter is provided with a vacuum.

12. A process according to claim 11, characterized in that after taking up the wire piece by the pressing tool, the vacuum wire holder is returned from the location of the third displaced position of the wire piece into the location of the second displaced position of the wire piece, subsequently is returned from the location the second displaced position of the wire piece into the location of the first displaced position of the wire piece concurrent with the returning of the tubular guide member into its initial position, and finally is returned into a position for gripping the protruding end of the spare wire.

13. In a process for the continuous production of at least one wire connection on a semi-conductor element, said process including preparing a wire piece, fusing a sphere onto both ends of said wire piece, and connecting the wire piece with heated contact locations on the semi-conductor element through thermal compression, the improvement comprising: providing a linear spare wire supported in a stationary tubular guide member and protruding therefrom with its leading end; gripping said protruding end and fusing-off a wire piece from the spare wire whilst concurrently fusing a sphere onto the fused-off ends of the wire piece and the spare wire; displacing the wire piece transversely to the longitudinal axis of the spare wire from its initial position into a first displaced position; embracing the spare wire in closely spaced relationship with forceps means between the tubular guide member and the sphere formed on the end of the spare wire; displacing both the forceps means and the wire piece in a direction along said axis for a predetermined distance, whereby upon displacement of the forceps means the sphere formed on the end of the spare wire contacts the forceps means and by continued displacement of the foreceps means is conveyed through motion of the spare wire into a predetermined position along said axis, and whereby the wire piece occupies a second displaced position; conveying the wire piece transversely to said axis towards a pressing tool, whereby the wire piece occupies a third displaced position; taking up the wire piece by the pressing tool; pressing both said spheres on the wire piece through actuation of the pressing tool onto said heated contact locations on the semi-conductor element; and concurrent with the pressing-on, gripping said protruding end of the spare wire adjacent said forceps means embracing the spare wire and fusing-off a subsequent wire piece from the spare wire.

14. A process as claimed in claim 13, characterized in that two said wire connections are concurrently produced on the semi-conductor element.

15. A process according to claim 14, characterized in that there are formed two wire connections of varied lengths.

16. A process according to claim 14, characterized in that there are formed two wire connections having a mutual angular displacement deviating from 180°.

17. A process according to claim 14, characterized in that there are formed two wire connections of varied lengths and having a mutual angular displacement deviating from 180°.

18. A process according to claim 13, characterized in that the first sphere formed on the wire piece is connected with a semi-conductor wafer of the semi-conductor element and the subsequently formed sphere on said wire piece is connected with a contact pin of the semi-conductor element.

19. A process according to claim 18, characterized in that said pressing of one said sphere of the wire piece onto the contact element of the semi-conductor element is delayed with respect to the pressing-on of the other sphere of said wire piece onto said semi-conductor element, so as to attain an arcuate configuration of the connecting wire piece.

20. A process according to claim 14, characterized in that, for the fusing-off the wire piece and the fusing-on of the spheres, there is utilized a flame.

21. A process according to claim 14, characterized in that, for the fusing-off the wire piece and the fusing-on of the spheres, there is utilized a light arc.

22. A process according to claim 13, characterized in that said forceps means from the sphere formed on the end of the spare wire after fusing-off a subsequent wire piece from the spare wire and prior to displacing the fused-off wire piece into the first displaced position.

23. A process according to claim 13, characterized in that for embracing the spare wire there is utilized forceps means including a pair of slides located in a common plane transverse to the longitudinal axis of the spare wire on opposite sides of the spare wire, said slides being moved in said common plane in opposite directions towards the spare wire so as to form a gap in which the spare wire is loosely located.

24. A process according to claim 13, characterized in that for gripping, displacing and conveying the wire piece there is utilized a vacuum wire holder and for taking up of the wire piece by the pressing tool the latter is provided with a vacuum.

25. A process according to claim 24, characterized in that after taking up the wire piece by the pressing tool, the vacuum wire holder is returned from the location of the third displaced position of the wire piece into the location of the second displaced position of the wire piece, subsequently is returned from the location the second displaced position of the wire piece into the location of the first displaced position of the wire piece, and finally is returned into a position for gripping the protruding end of the spare wire.

26. In a process for the continuous production of at least one wire connection on a semi-conductor element, said process including preparing a wire piece, fusing a sphere onto both ends of said wire piece, and connectiing the wire piece with heated contact locations on the semi-conductor element through thermal compression, the improvement comprising: providing a linear spare wire supported in a tubular guide member and protruding therefrom with its leading end; gripping said protruding end and fusing-off a wire piece from the spare wire whilst concurrently fusing a sphere onto the fused-off ends of the wire piece and the spare wire; displacing the wire piece transversely to the longitudinal axis of the spare wire from its initial position into a first displaced position; displacing both the spare wire and the wire piece in a direction along said axis for a predetermined distance, whereby the wire piece occupies a second displaced position; conveying the wire piece transversely to said axis towards a pressing tool, whereby the wire piece occupies a third displaced position; taking up the wire piece by the pressing tool; pressing both said spheres on the wire piece through actuation of the pressing tool onto said heated contact locations on the semi-conductor element; and concurrent with the pressing-on, gripping said protruding end of the spare wire and fusing-off a subsequent wire piece from the spare wire.

* * * * *